United States Patent
Lin

(10) Patent No.: US 12,249,989 B1
(45) Date of Patent: Mar. 11, 2025

(54) FOUR-PHASE CLOCK BUFFER OF TWENTY-FIVE PERCENT DUTY CYCLE

(71) Applicant: Realtek Semiconductor Corp., Hsinchu (TW)

(72) Inventor: Chia-Liang (Leon) Lin, Fremont, CA (US)

(73) Assignee: Realtek Semiconductor Corp., Hsinchu (TW)

(*) Notice: Subject to any disclaimer, the term of this patent is extended or adjusted under 35 U.S.C. 154(b) by 82 days.

(21) Appl. No.: 18/455,676

(22) Filed: Aug. 25, 2023

(51) Int. Cl.
*H03K 3/017* (2006.01)
*H03K 3/356* (2006.01)

(52) U.S. Cl.
CPC ....... *H03K 3/017* (2013.01); *H03K 3/356113* (2013.01)

(58) Field of Classification Search
CPC ............. H03K 3/017; H03K 3/356113; H03K 3/356104; H03K 3/356121; H03K 3/356165; H03K 3/356173; H03K 3/356182; H03K 3/356191; H03K 3/00; H03K 3/013; H03K 3/027; H03K 3/037; H03K 5/133; H03K 5/134; H03K 5/135; H03K 5/14; H03K 19/096; H03K 19/0963; H03K 5/1565; G06F 1/10; G06F 1/12; H03L 7/00; H03L 7/06; H03L 7/08; H03L 7/083
See application file for complete search history.

(56) References Cited

U.S. PATENT DOCUMENTS 10,148,257 B1 * 12/2018 Lin .................. H03K 5/08

* cited by examiner

*Primary Examiner* — Jung Kim
(74) *Attorney, Agent, or Firm* — McClure, Qualey & Rodack, LLP

(57) ABSTRACT

A two-stage 4-phase clock buffer having a cascade of a first stage and a second stage, wherein: the first stage includes four p-channel oxide semiconductor transistors (PMOSTs) configured in a common-source ring topology to dispatch a first 4-phase clock, and four n-channel oxide semiconductor transistors (NMOSTs) configured in a common-source topology to control the first 4-phase clock in response to a second 4-phase clock; and, the second stage includes four NMOS transistors configured in a common-source ring topology to dispatch a third 4-phase clock, and four PMOS transistors configured in a common-source topology to control the third 4-phase clock in response to the first 4-phase clock.

12 Claims, 3 Drawing Sheets

FOUR-PHASE CLOCK BUFFER OF TWENTY-FIVE PERCENT DUTY CYCLE

BACKGROUND OF THE DISCLOSURE

Field of the Disclosure

The present disclosure generally relates to clock buffers, and particularly to four-phase clock buffers of twenty-five percent duty cycle.

Description of Related Art

As understood by persons skilled in the art, a signal is a voltage of a variable level that carries a certain information and can vary with time. A level of the signal at a given moment represents a state of the signal at that moment. A logical signal is a signal of two states: a low state and a high state; the logical signal is in the high state when its voltage level is above a trip point and in the low state otherwise. Regarding a logical signal Q, "Q is high" or "Q is low," means that "Q is in the high state" or "Q is in the low state." A first logical signal may not necessarily have the same trip point as a second logical signal. A first logical signal is said to be a logical inversion of a second logical signal, if the first logical signal and the second logical signal are always in opposite states. That is, when the first logical signal is low (high), the second logical signal is high (low). When a logical signal makes a low-to-high (L2H) transition, a rising edge occurs; when a logical signal makes a high-to-low (H2L) transition, a falling edge occurs.

A clock is a logical signal that cyclically toggles between a low state and a high state; a duty cycle of the clock refers to a percentage of time that the clock stays in the high state. A four-phase clock refers to a collection of four clocks including a first clock, a second clock, a third clock, and a fourth clock that have the same waveform but sequentially and evenly distributed in time; the first clock, the second clock, the third clock, and the fourth clock are referred to as a first phase, a second phase, a third phase, and a fourth phase of the four-phase clock, respectively.

A clock buffer receives an input clock and outputs an output clock so that the output clock has a larger swing, or a sharper state transition, or both, than the input clock. A clock buffer is either inverting or non-inverting. For an inverting clock buffer, the output clock is a logical inversion of the input clock. For a non-inverting clock buffer, the output clock is logically the same as the input clock but has a larger swing, or a sharper state transition, or both.

An inverter is a circuit that receives an input clock and outputs an output clock that is an inversion of the input clock and can be used to embody an inverting clock buffer. Due to the inversion, a duty cycle of the output clock is one hundred percent minus a duty cycle of the input clock. For instance, if the duty cycle of the input clock is 25% (75%), the duty cycle of the output clock will be 75% (25%); that's because, if the input clock is in the high state 25% (75%) of the time, the output clock will be in the low state 25% (75%) of the time, and thus in the high state 75% (25%) of the time. A cascade of two inverters can be used to embody a non-inverting clock buffer, wherein a duty cycle of an output clock will be the same as a duty cycle of an input clock.

Four-phase (hereafter 4-phase) clocks are widely used in radio transceivers. In many applications, a 4-phase clock of 25% duty cycle is needed. Four inverters can be used to embody an inverting clock buffer for a 4-phase input clock of 25% duty cycle, wherein each of the four inverters receives a respective phase of the 4-phase input clock and outputs a respective phase of a 4-phase output clock, which is of 75% duty cycle. A cascade of two such inverting clock buffers can embody a non-inverting clock buffer for a 4-phase input clock of 25% duty cycle and output a 4-phase output clock of 25% duty cycle.

Clock buffers may be integrated and fabricated on a silicon substrate using a CMOS (complementary metal oxide semiconductor) process technology, wherein an inverter comprises a NMOS (n-channel metal oxide semiconductor) transistor and a PMOS (p-channel metal oxide semiconductor) transistor; this is well understood by those of ordinary skill in the art and thus not described in further detail. An issue of using an inverter to embody a clock buffer is, a L2H transition of the output clock is caused by a pull-up of a PMOST, while a L2H transition of the output clock is caused by a pull-down of a NMOST. A strength of pull-up of a PMOST and a strength of pull-down of a NMOST are usually different. Even if they can be designed to be equal in a nominal case, they'll vary and generally differ under variation in process, supply voltage, and temperature. As a result, a rise time (of a rising edge) and a fall time (of a falling edge) are generally different, and consequently a duty cycle of an output clock of an inverter is subject to deviate. This issue is particularly problematic for a high-speed clock, wherein a small error in rise time and/or fall time may lead to a big error in duty cycle, because a period of a high-speed clock is small. Moreover, in a multi-stage scenario, wherein a plurality of stages of clock buffer is cascaded, each stage of clock buffer may contribute an error in duty cycle, and errors from all stages are accumulated, and at the end the duty cycle can be seriously off.

What is desired is clock buffer tailored for a four-phase, 25% duty cycle clock that can tolerate process, supply voltage, and temperature variation better, and the errors will not be accumulated in a multi-stage scenario.

BRIEF DESCRIPTION OF THIS DISCLOSURE

An objective of this present invention is to have a four-phase (hereafter 4-phase) clock buffer that can output a 4-phase output clock of approximately 75% duty cycle in response to a 4-phase input clock of a duty cycle that is approximately 25% but does not need to be 25%.

Another objective of this present invention is to have a 4-phase clock buffer that can output a 4-phase output clock of approximately 25% duty cycle in response to a 4-phase input clock of a duty cycle that is approximately 75% but does not need to be 75%.

Another objective of this present invention is to have a two-stage clock buffer that receives a 4-phase input clock of a duty cycle that is approximately 25% but does not need to be 25% an output a 4-phase output clock of a duty that is approximately 25% without accumulating errors in duty cycle from said multiple stages.

Yet another objective of this present invention is to have a multi-stage clock buffer comprising a cascade of multiple stages that can output a 4-phase clock of approximately 25% duty cycle without accumulating errors in duty cycle from said multiple stages.

In an embodiment, 4-phase clock buffer comprises: a first p-channel metal oxide semiconductor transistor (hereafter PMOST), a second PMOST, a third PMOST, and a fourth PMOST configured in a common-source ring topology to dispatch a first phase, a second phase, a third phase, and a fourth phase of a 4-phase output clock, respectively; and, a first n-channel metal oxide semiconductor transistor (hereafter NMOST), a second NMOST, a third NMOST, and a fourth NMOST configured in a common-source topology to control the first phase, the second phase, the third phase, and the fourth phase of the 4-phase output clock, in response to a first phase, a second phase, a third phase, and a fourth phase of a 4-phase input clock, respectively.

In an embodiment, 4-phase clock buffer comprises: a first NMOST, a second NMOST, a third NMOST, and a fourth NMOST configured in a common-source ring topology to dispatch a first phase, a second phase, a third phase, and a fourth phase of a 4-phase output clock, respectively; a first PMOST, a second PMOST, a third PMOST, and a fourth PMOST configured in a common-source topology to control the first phase, the second phase, the third phase, and the fourth phase of the 4-phase output clock, in response to a first phase, a second phase, a third phase, and a fourth phase of a 4-phase input clock, respectively.

In an embodiment, a two-stage 4-phase clock buffer comprises a cascade of a first stage and a second stage, wherein: the first stage comprises four p-channel oxide semiconductor transistors (PMOSTs) configured in a common-source ring topology to dispatch a first 4-phase clock, and four n-channel oxide semiconductor transistors (NMOSTs) configured in a common-source topology to control the first 4-phase clock in response to a second 4-phase clock; and, the second stage comprises four NMOS transistors configured in a common-source ring topology to dispatch a third 4-phase clock, and four PMOS transistors configured in a common-source topology to control the third 4-phase clock in response to the first 4-phase clock.

DETAILED DESCRIPTION OF THIS DISCLOSURE

Figure 1:
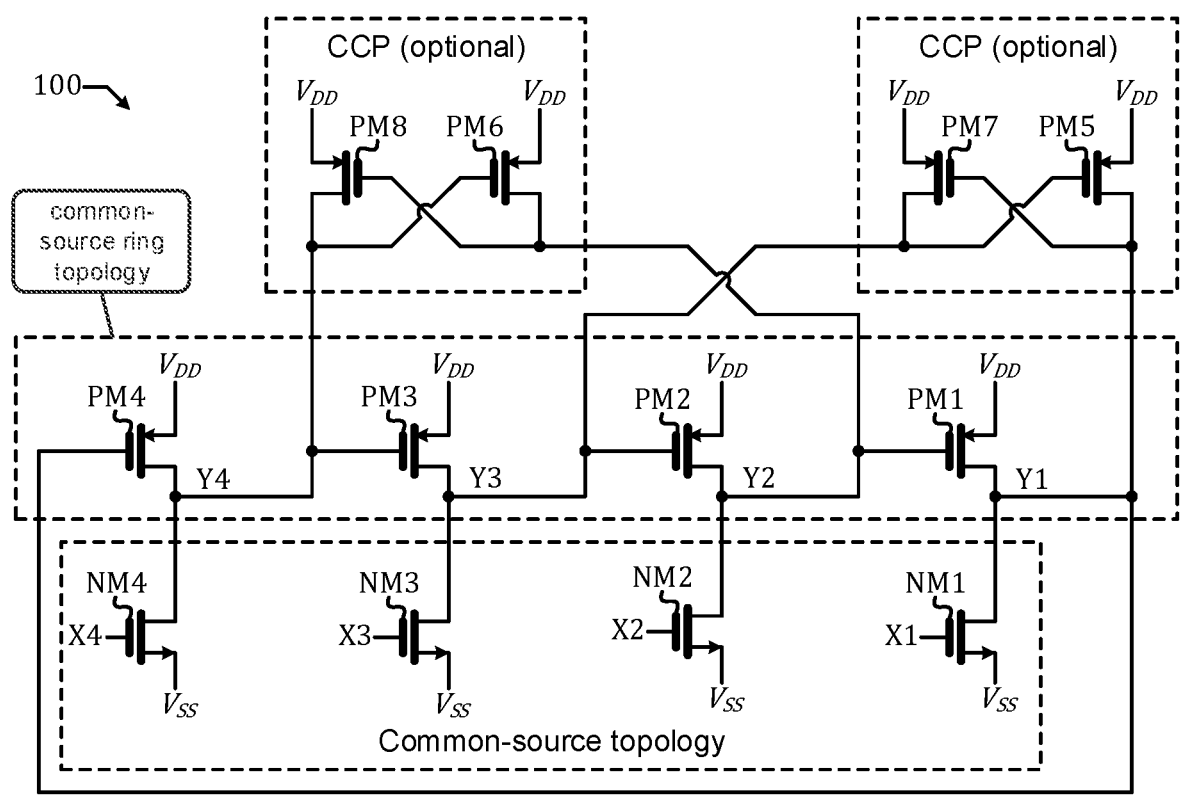
FIG. 1 shows a schematic diagram of a 4-phase clock buffer in accordance with an embodiment of the present disclosure.

The present disclosure is directed to clock buffer. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "logical signal," "clock," "phase," "duty cycle," "period," "common-source," "power supply," "ground," "noise," "CMOS (complementary metal oxide semiconductor)," "NMOST (n-channel metal-oxide semiconductor transistor)," "PMOST (p-channel metal-oxide semiconductor transistor)," and "cross couple." Terms like these are used in a context of microelectronics, and the associated concepts are apparent to those of ordinary skills in the art and thus will not be explained in detail here.

Those of ordinary skill in the art can recognize a MOST (metal-oxide semiconductor transistor) symbol, and identify the "source," the "gate," and the "drain" terminals thereof, for both PMOST (p-channel metal-oxide semiconductor) and NMOST (n-channel metal-oxide semiconductor). Those of ordinary skills in the art can read schematics of a circuit comprising NMOST and PMOST, and do not need a verbose description about how one component connects with another in the schematics.

This present disclosure is disclosed from an engineering perspective. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

A power supply node is a circuit node of a voltage that is approximately equal to a power supply voltage that is higher than zero but might have a small high-frequency fluctuation. A ground node is a circuit node of a voltage that is approximately zero but might have a small high-frequency fluctuation. Throughout this disclosure, "$V_{DD}$" denotes a power supply node and "$V_{SS}$" denotes a ground node.

A NMOST is configured in a "common-source" topology when an input is received from its gate and an output is output at its drain, while its source is connected to a ground node, e.g. "$V_{SS}$."

A PMOST is configured in a "common-source" topology when an input is received from its gate and an output is output at its drain, while its source is connected to a power supply node, e.g. "$V_{DD}$."

A schematic diagram a 4-phase clock buffer 100 in accordance with an embodiment of the present invention is shown in FIG. 1. The 4-phase clock buffer 100 receives a 4-phase input clock comprising four phases: X1, X2, X3, and X4, and outputs a 4-phase output clock comprising four phases: Y1, Y2, Y3, and Y4. The 4-phase clock buffer 100 comprises: four PMOSTs PM1, PM2, PM3, and PM4 configured in a common-source ring topology to dispatch Y1, Y2, Y3, and Y4, respectively; and four NMOSTs NM1, NM2, NM3, and NM4, configured in a common-source topology to control Y1, Y2, Y3, and Y4, in accordance with X1, X2, X3, and X4, respectively. PM1, PM2, PM3, PM4 have a form of a 4-stage ring oscillator but cannot sustain an oscillation, because they can pull up but cannot pull down Y1, Y2, Y3, and Y4. Pull-downs of Y1, Y2, Y3, and Y4 are carried out by NM1, NM2, NM3, and NM4 in accordance with X1, X2, X3, and X4, respectively.

Figure 2:
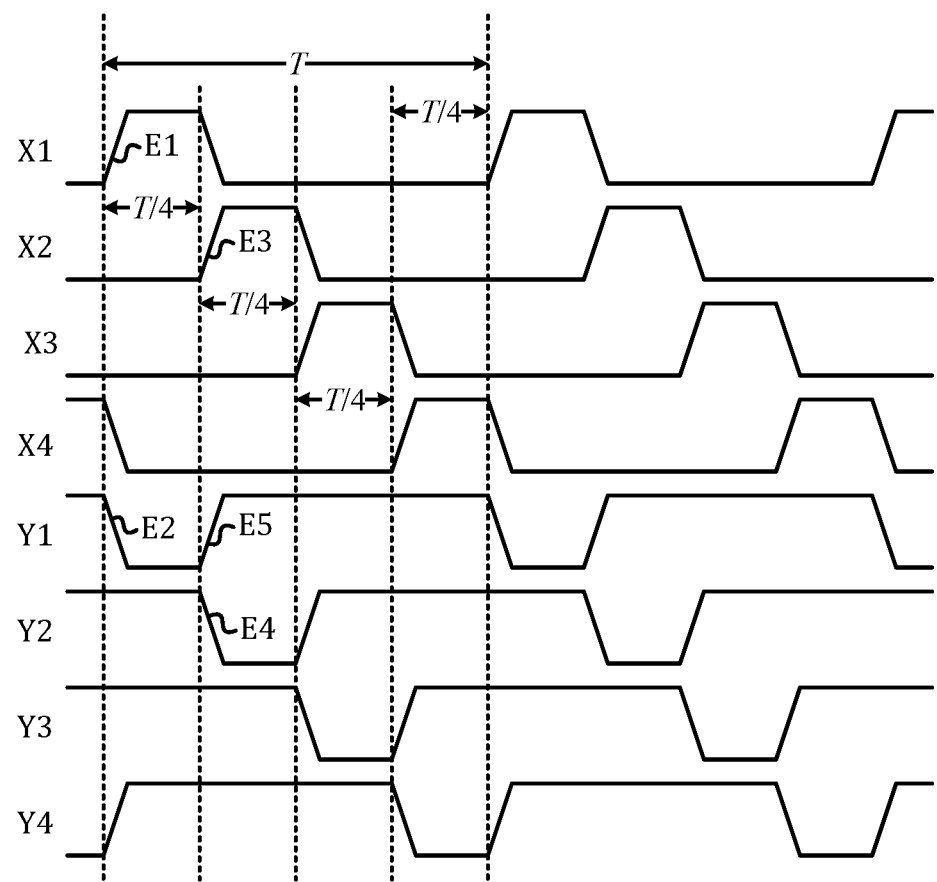
FIG. 2 shows an exemplary timing diagram of the 4-phase clock buffer of FIG. 1.

In an embodiment, a duty cycle of the 4-phase input clock is nominally 25%. An exemplary timing diagram of the 4-phase clock buffer 100 is shown in FIG. 2. As shown, X1, X2, X3, and X4 are four phases of the 4-phase input clock of a period T, and are evenly spread in time with T/4 spacing. Y1, Y2, Y3, and Y4 are four phases of the 4-phase output clock of a period T and 75% duty cycle and are evenly spread in time with T/4 spacing. A low-to-high transition (L2H) E1 of X1 prompts NM1 to pull down Y1, resulting in a high-to-low transition (H2L) E2 of Y1. A L2H E3 of X2 follows the L2H E1 of X1 after a time of T/4 and prompts NM2 to pull down Y2, resulting a H2L E4 of Y2 that consequently prompts PM1 to pull up Y1, resulting in L2H E5. This way, Y1 is pulled down by NM1 and then pulled up by PM1 with a time separation of approximately T/4, securing an approximately 75% duty cycle. The same analysis applies to Y2, Y3, and Y4. Since the H2L E2 of Y1 is driven by the L2H E1 of X1 and the ensuing L2H E5 of Y1 is driven by the L2H E3 of X2, a time separation of the H2L E2 the L2H E5 of Y1 and consequently a duty cycle of Y1 is dictated by a time separation between the L2H E1 of X1 and the L2H E3 of X2, which is T/4 due to the 4-phase nature of the input clock, and independent of the duty cycle of X1 and X2, as long as a pull-up of PM1 is stronger than a pull-down of NM1 when X1 is high and Y2 is low. In other words, even if the duty-cycle of the 4-phase input clock (comprising X1, X2, X3, and X4) is not 25%, the duty cycle of the 4-phase output clock (comprising Y1, Y2, Y3, and Y4) is still approximately 75%, provided the pull-up of PM1, PM2, PM3, and PM4 is stronger than the pull-down of NM1, NM2, NM3, and NM4. However, it is desirable that the duty cycle of the 4-phase input clock (comprising X1, X2, X3, and X4) is not greater than 25% to avoid contention between a pull-up of NM1, NM2, NM3, and NM4 and a pull-down of PM1, PM2, PM3, and PM4, respectively.

In an optional embodiment, the 4-phase clock buffer 100 further comprises four additional PMOSTs PM5, PM6, PM7, and PM8, wherein PM5 and PM7 form a first cross-coupling pair (CCP) configured to cross couple Y1 and Y3 and PM6 and PM8 form a second CCP configured to cross couple Y2 and Y4. Due to cross coupling, PM5 and PM7 ensure that Y1 and Y3 cannot be both low, while PM6 and PM8 ensure that Y2 and Y4 cannot be both low. This way, none of Y1, Y2, Y3, and Y4 can stay in the low state for more than 50% of time, and the duty cycle of the 4-phase output clock is therefore ensured to be no greater than 50%, regardless of the duty cycle of the 4-phase input clock.

Figure 3:
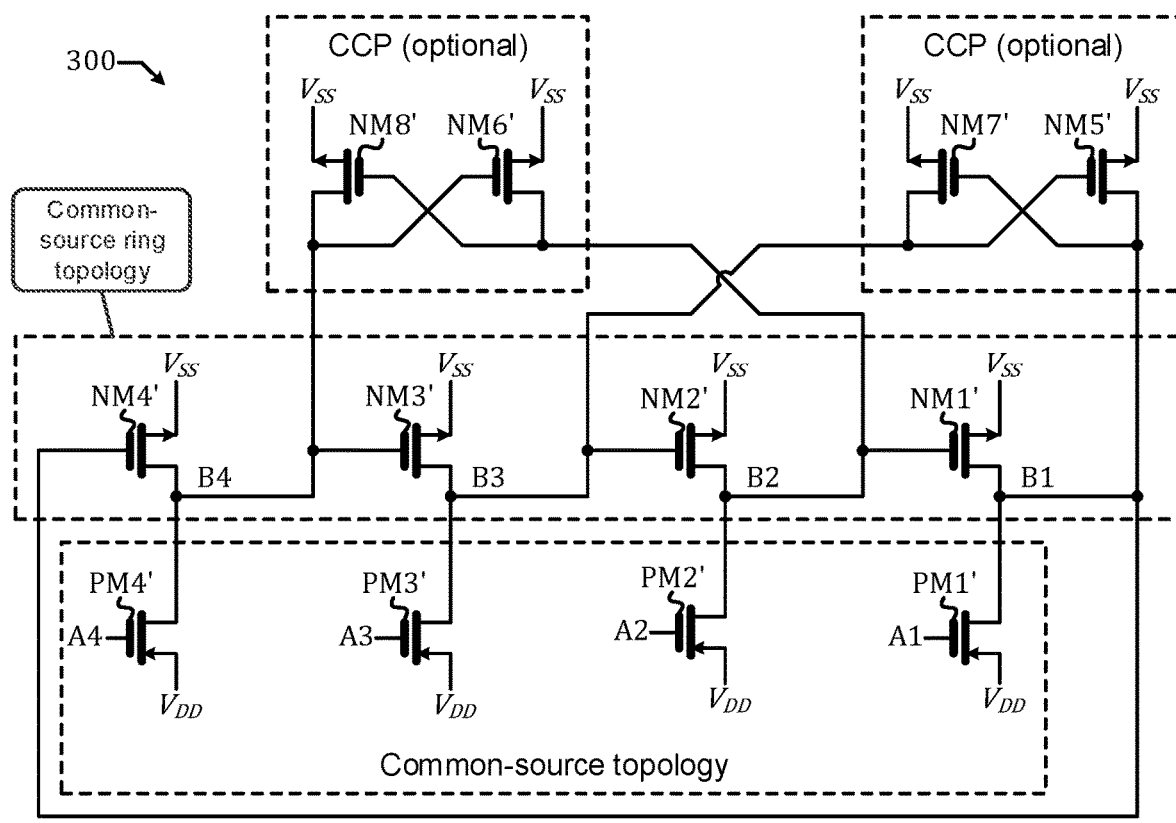
FIG. 3 shows a schematic diagram of a 4-phase clock buffer in accordance with another embodiment of the present disclosure.

The 4-phase clock buffer 100 can be used to generate a 4-phase output clock of approximately 75% duty cycle in response to a 4-phase input clock that is approximately but not necessarily of 25% duty cycle, as explained earlier. If a 4-phase output clock of 25% duty cycle is needed, a 4-phase clock buffer 300 shown in FIG. 3 can be used. The 4-phase clock buffer 300 is adapted from the 4-phase clock buffer 100 by applying the following changes: (1) NMOST and PMOST are swapped, i.e., NM1, NM2, NM3, and NM4 are replaced with PM1', PM2', PM3', and PM4', respectively, and PM1, PM2, PM3, PM4, PM5, PM6, PM7, and PM8 are replaced with NM1', NM2', NM3', NM4', NM5', NM6' NM7', and NM8', respectively; and (2) the power supply node "$V_{DD}$" and the ground node "$V_{SS}$" are swapped. In addition, for distinction, X1, X2, X3, X4, Y1, Y2, Y3, and Y4 are replaced by A1, A2, A3, A4, B1, B2, B3, and B4, respectively. Those or ordinary skill in the art can readily recognize that, the 4-phase clock buffer 300 is functionally the same as the 4-phase clock buffer 100, but the high state and the low state are swapped (since the power supply node "$V_{DD}$" and the ground node "$V_{SS}$" are swapped). Therefore, the 4-phase output clock of the 4-phase clock buffer 300, which is composed of B1, B2, B3, and B4, is of approximately 25% duty cycle, and the duty cycle of the 4-phase input clock, which is composed of A1, A2, A3, and A4, is nominally but not necessarily 75%.

By using the 4-phase clock buffer 100 followed by the 4-phase clock buffer 300, one has a two-stage clock buffer that can output an approximately 25% duty cycle output clock in response to a 25% duty cycle input clock. By using the 4-phase clock buffer 300 followed by the 4-phase clock buffer 100, one has a two-stage clock buffer that can output an approximately 75% duty cycle output clock in response to a 75% duty cycle input clock. In any case, a multi-stage clock buffer can be constructed from alternately instantiating the 4-phase clock buffer 100 and the 4-phase clock buffer 300, such that one instance of the 4-phase clock buffer 100 is followed by one instance of the 4-phase clock buffer 300, and/or one instance of the 4-phase clock buffer 300 is followed by one instance of the 4-phase clock buffer 100.

In an embodiment, a two-stage 4-phase clock buffer comprises a cascade of a first stage and a second stage, wherein: the first stage is instantiated from the 4-phase clock buffer 100 and thus comprises four PMOSTs (such as PM1, PM2, PM3, and PM4) configured in a common-source ring topology to dispatch a first 4-phase clock (such as Y1, Y2, Y3, and Y4) and four NMOSTs transistors (such as NM1, NM2, NM3, and NM4) configured in a common-source topology to control the first 4-phase clock in response to a second 4-phase clock (such as X1, X2, X3, and X4); the second stage is instantiated from the 4-phase clock buffer 300 and comprises four NMOSTs (such as NM1', NM2', NM3', and NM4') configured in a common-source ring topology to dispatch a third 4-phase clock (such as B1, B2, B3, and B4) and four PMOSTs (such as PM1', PM2', PM3', and PM4') configured in a common-source topology to control the third 4-phase clock in response to the first 4-phase clock.

The 4-phase clock buffer 100 and the 4-phase clock buffer 300 are superior to inverter buffer in that, the duty cycle of the output clock is independent of (or at least highly insensitive to) the duty cycle of the input clock, therefore in a multi-stage clock buffer constructed from instantiating the 4-phase clock buffer 100 and the 4-phase clock buffer 300, errors of duty cycle from constituent clock buffers will not be accumulated, and therefore the duty cycle of the output clock can be highly insensitive to process, supply voltage, and temperature variation.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A four-phase (hereafter 4-phase) clock buffer comprising:
   a first p-channel metal oxide semiconductor transistor (hereafter PMOST), a second PMOST, a third PMOST, and a fourth PMOST configured in a common-source ring topology to dispatch a first phase, a second phase, a third phase, and a fourth phase of a 4-phase output clock, respectively; and,
   a first n-channel metal oxide semiconductor transistor (hereafter NMOST), a second NMOST, a third NMOST, and a fourth NMOST configured in a common-source topology to control the first phase, the second phase, the third phase, and the fourth phase of the 4-phase output clock, in response to a first phase, a second phase, a third phase, and a fourth phase of a 4-phase input clock, respectively.

2. The 4-phase clock buffer of claim 1, wherein a duty cycle of the 4-phase input clock is approximately 25%.

3. The 4-phase clock buffer of claim 1 further comprising: a fifth PMOST, a sixth PMOST, a seventh PMOST, and an eighth PMOST, wherein the fifth PMOST and the seventh PMOST are configured in a cross-coupling topology to cross couple the first phase and the third phase of the 4-phase output clock, while the sixth PMOST and the eighth PMOST are configured in a cross-coupling topology to cross couple the second phase and the fourth phase of the 4-phase output clock.

4. The 4-phase clock buffer of claim 1, wherein a drain of the first PMOST is coupled to a drain of the first NMOST, a drain of the second PMOST is coupled to a drain of the second NMOST, a drain of the third PMOST is coupled to a drain of the third NMOST, and a drain of the fourth PMOST is coupled to a drain of the fourth NMOST.

5. The 4-phase clock buffer of claim 4, wherein the first phase of the input clock is applied to a gate of the first NMOST, the second phase of the input clock is applied to a gate of the second NMOST, the third phase of the input clock is applied to a gate of the third NMOST, and the fourth phase of the input clock is applied to a gate of the fourth NMOST.

6. A four-phase (hereafter 4-phase) clock buffer comprising:
- a first n-channel metal oxide semiconductor transistor (hereafter NMOST), a second NMOST, a third NMOST, and a fourth NMOST configured in a common-source ring topology to dispatch a first phase, a second phase, a third phase, and a fourth phase of a 4-phase output clock, respectively; and,
- a first p-channel metal oxide semiconductor transistor (hereafter PMOST), a second PMOST, a third PMOST, and a fourth PMOST configured in a common-source topology to control the first phase, the second phase, the third phase, and the fourth phase of the 4-phase output clock, in response to a first phase, a second phase, a third phase, and a fourth phase of a 4-phase input clock, respectively.

7. The 4-phase clock buffer of claim 6, wherein a duty cycle of the 4-phase input clock is approximately 75%.

8. The 4-phase clock buffer of claim 6 further comprising: a fifth NMOST, a sixth NMOST, a seventh NMOST, and an eighth NMOST, wherein the fifth NMOST and the seventh NMOST are configured in a cross-coupling topology to cross couple the first phase and the third phase of the 4-phase output clock, while the sixth NMOST and the eighth NMOST are configured in a cross-coupling topology to cross couple the second phase and the fourth phase of the 4-phase output clock.

9. The 4-phase clock buffer of claim 6, wherein a drain of the first PMOST is coupled to a drain of the first NMOST, a drain of the second PMOST is coupled to a drain of the second NMOST, a drain of the third PMOST is coupled to a drain of the third NMOST, and a drain of the fourth PMOST is coupled to a drain of the fourth NMOST.

10. The 4-phase clock buffer of claim 9, wherein the first phase of the input clock is applied to a gate of the first PMOST, the second phase of the input clock is applied to a gate of the second PMOST, the third phase of the input clock is applied to a gate of the third PMOST, and the fourth phase of the input clock is applied to a gate of the fourth PMOST.

11. A two-stage four-phase (hereafter 4-phase) clock buffer comprising a cascade of a first stage and a second stage, wherein:
- the first stage comprises four p-channel oxide semiconductor transistors (PMOSTs) configured in a common-source ring topology to dispatch a first 4-phase clock, and four n-channel oxide semiconductor transistors (NMOSTs) configured in a common-source topology to control the first 4-phase clock in response to a second 4-phase clock; and
- the second stage comprises four NMOSTs configured in a common-source ring topology to dispatch a third 4-phase clock, and four PMOSTs configured in a common-source topology to control the third 4-phase clock in response to the first 4-phase clock.

12. The two-stage 4-phase clock buffer of claim 11, wherein a duty cycle of the second 4-phase clock is approximately 25%.

* * * * *